United States Patent
Lee

(10) Patent No.: US 8,188,509 B2
(45) Date of Patent: May 29, 2012

(54) ORGANIC LIGHT EMITTING DISPLAY DEVICE

(75) Inventor: Kyung-Jun Lee, Yongin (KR)

(73) Assignee: Samsung Mobile Display Co., Ltd., Nongseo-Dong, Giheung-Gu, Yongin, Gyunggi-Do (KR)

( * ) Notice: Subject to any disclaimer, the term of this patent is extended or adjusted under 35 U.S.C. 154(b) by 133 days.

(21) Appl. No.: 12/851,039

(22) Filed: Aug. 5, 2010

(65) Prior Publication Data

US 2011/0114991 A1 May 19, 2011

(30) Foreign Application Priority Data

Nov. 18, 2009 (KR) .................. 10-2009-0111538

(51) Int. Cl.
*H01L 33/00* (2010.01)

(52) U.S. Cl. ............... 257/100; 257/40; 257/E33.059; 313/512; 445/25

(58) Field of Classification Search ............ 257/40, 257/99, 100, E33.059; 313/509, 512; 438/26; 445/25
See application file for complete search history.

(56) References Cited

U.S. PATENT DOCUMENTS

| | | | | |
|---|---|---|---|---|
| 7,255,823 B1* | 8/2007 | Guenther et al. | ............. | 264/263 |
| 7,431,628 B2* | 10/2008 | Park et al. | ............. | 445/25 |
| 7,663,314 B2 | 2/2010 | Kim et al. | | |
| 7,834,550 B2* | 11/2010 | Lee et al. | ............. | 313/512 |
| 7,906,376 B2* | 3/2011 | Swaminathan | ............. | 438/122 |
| 8,063,561 B2* | 11/2011 | Choi et al. | ............. | 313/512 |
| 2007/0172971 A1* | 7/2007 | Boroson | ............. | 438/26 |
| 2008/0238311 A1 | 10/2008 | Sung et al. | | |
| 2009/0009046 A1 | 1/2009 | Oh et al. | | |
| 2009/0195147 A1 | 8/2009 | Song et al. | | |
| 2010/0013740 A1 | 1/2010 | Tanaka et al. | | |

FOREIGN PATENT DOCUMENTS

| | | |
|---|---|---|
| JP | 2001167875 | 6/2001 |
| JP | 2005-285573 | 10/2005 |
| JP | 2008-235089 A | 10/2008 |
| KR | 1020090000314 | 1/2009 |
| KR | 10-2009-0084528 A | 8/2009 |

OTHER PUBLICATIONS

Korean Office Action issued by KIPO, dated Apr. 12, 2011, corresponding to Korean Patent Application No. 10-2009-0111538, together with Request for Entry.

Korean registration Determination Certificate issued by KIPO on Nov. 30, 2011, corresponding to KR 10-2009-0111538 and Request for Entry attached herewith.

* cited by examiner

*Primary Examiner* — Tuan N. Quach
(74) *Attorney, Agent, or Firm* — Robert E. Bushnell, Esq.

(57) ABSTRACT

An organic light emitting display device which prevents deterioration of an organic light emitting diode (OLED), the organic light emitting display device includes a first substrate including a display unit that includes at least one organic light emitting diode (OLED), a second substrate facing the first substrate and bonded to the first substrate, a sealant arranged surrounding the display unit and bonding the first substrate to the second substrate, a dam portion arranged between the display unit and the sealant and surrounding a periphery of the display unit and including a plurality of magnetic particles and a filling material arranged within an inner space of the dam portion and between the first and second substrates and including a plurality of magnetic particles.

19 Claims, 6 Drawing Sheets

ORGANIC LIGHT EMITTING DISPLAY DEVICE

CLAIM OF PRIORITY

This application makes reference to, incorporates the same herein, and claims all benefits accruing under 35 U.S.C. §119 from an application earlier filed in the Korean Intellectual Property Office on 18 Nov. 2009 and there duly assigned Serial No. 10-2009-0111538.

BACKGROUND OF THE INVENTION

1. Field of the Invention

The present invention relates to a design of an organic light emitting display device that prevents deterioration of an organic light emitting diode (OLED).

2. Description of the Related Art

Organic light emitting display devices are a type of flat display device in which an organic light emitting layer is interposed between two opposed electrodes, electrons are injected from one (a cathode) of the opposed electrodes and holes injected from the other electrode (an anode) thereof and are combined in the organic light emitting layer. Light-emitting molecules in the organic light emitting layer are excited through the combination and then are returned to a base state upon the release of energy in the form of a photon of visible light.

The organic light emitting display devices have excellent visibility, are light in weight, and have a small size, and are driven with a low voltage and thus have drawn attention as a next-generation display device.

However, these organic light emitting display devices deteriorate due to the penetration of oxygen and moisture therein from the outside. In order to solve this problem, recently, an organic light emitting diode (OLED) is sealed using an inorganic sealant such as fit. In a structure for sealing an OLED using frit, the space between two substrates is completely sealed by curing melted frit and thus a moisture absorbent material does not need to be used and the OLED may be more efficiently protected.

However, in the structure for sealing the OLED using frit, due to the fragility of frit, when an external shock is applied to the structure, stress may concentrate on an adhering surface of the substrate on which frit is applied, and thus cracks occur in the adhering surface and spread to the entire substrate.

SUMMARY OF THE INVENTION

The present invention provides an organic light emitting display device with improved strength and that prevents deterioration of an organic light emitting diode (OLED).

According to an aspect of the present invention, there is provided an organic light emitting display device that includes a first substrate including a display unit that includes at least one organic light emitting diode (OLED), a second substrate facing the first substrate, a sealant surrounding a periphery of the display unit and bonding the second substrate to the first substrate, a dam portion arranged between the periphery of the display unit and the sealant and surrounding the periphery of the display unit and including a plurality of magnetic particles and a filling material arranged within an inner space defined by the dam portion and the first and second substrates, the filling material including a plurality of magnetic particles.

The sealant may comprise frit. The organic light emitting display device can also include an inorganic insulating layer arranged on the first substrate and extending from the display unit to outside a periphery of the display unit, wherein the frit is arranged on the inorganic insulating layer. Facing and adjacent surfaces of the dam portion and the filling material may repel each other due to the magnetic particles in the filling material and the magnetic particles in the dam portion. The filling material may also include non-magnetic particles having no magnetism. The dam portion may be separated from the sealant by an interval. The sealant may include a plurality of magnetic particles. Facing and adjacent surfaces of the sealant and the dam portion may repel each other due to the magnetic particles in the sealant and the magnetic particles in the dam portion.

According to another aspect of the present invention, there is provided an organic light emitting display device a first substrate including a display unit that includes at least one organic light emitting diode (OLED), a second substrate facing the first substrate, a sealant surrounding a periphery of the display unit and bonding the second substrate to the first substrate, a first dam portion arranged on a surface of the first substrate facing the second substrate, the first dam portion being arranged between the display unit and the sealant and surrounding the periphery of the display unit, the first dam portion including a plurality of magnetic particles, a second dam portion arranged on a surface of the second substrate correspondingly facing the first dam portion and including a plurality of magnetic particles and a filling material arranged within a space defined by the first and second dam portions and the first and second substrates, the filling material including a plurality of magnetic particles.

The sealant may include frit. The organic light emitting display device may further include an inorganic insulating layer arranged on the first substrate and extending from the display unit to outside a periphery of the display unit, wherein the frit is arranged on the inorganic insulating layer. The first and second dam portions may repel each other due to the first and second dam portions each comprising a plurality of magnetic particles. The first and second dam portions may be separated from each other by an interval. A sum of a height of the first dam portion and a height of the second dam portion may be less than a gap between the first and second substrates. The filling material and the first and second dam portions may repel each other due to the magnetic particles in each of the filling material and the first and second dam portions. The filling material may also include non-magnetic particles having no magnetism. The first and second dam portions may be separated from the sealant by an interval. The sealant may include a plurality of magnetic particles. The sealant and the first and second dam portions may repel each other due to the magnetic particles in the sealant and in the magnetic particles in the first and second dam portions.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described in detail by explaining exemplary embodiments of the invention with reference to the attached drawings.

Figure 1:
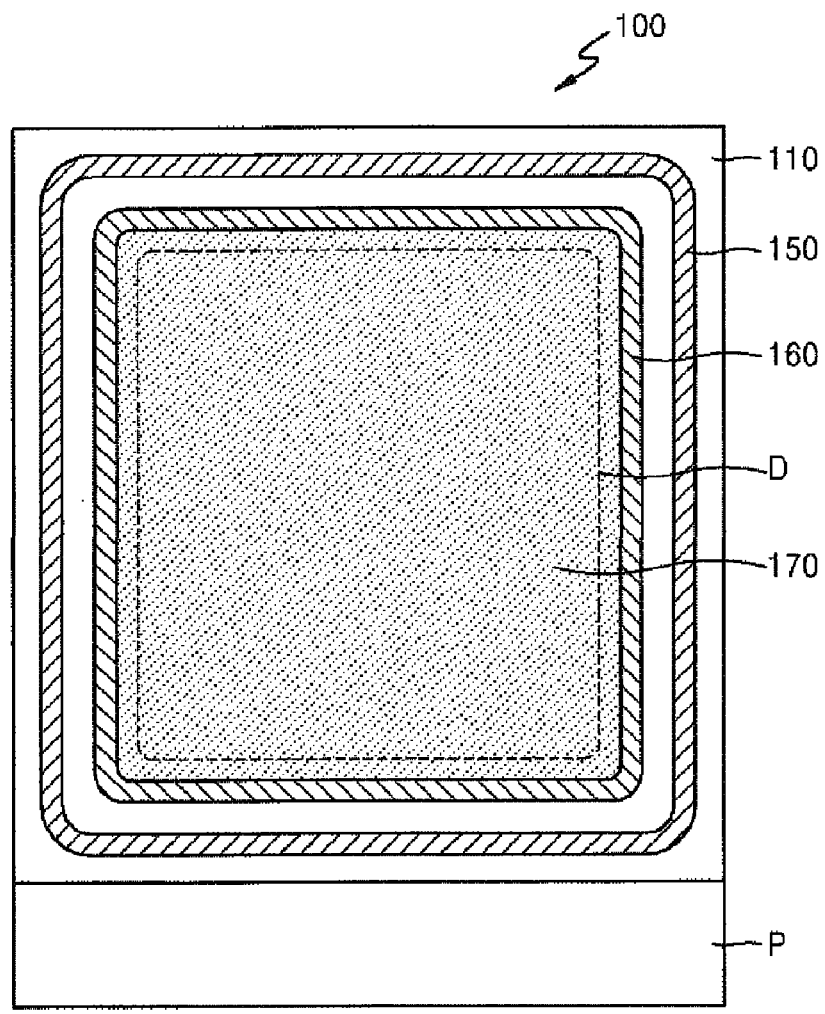
FIG. 1 is a schematic plan view of part of an organic light emitting display device according to an embodiment of the present invention.
Figure 2:
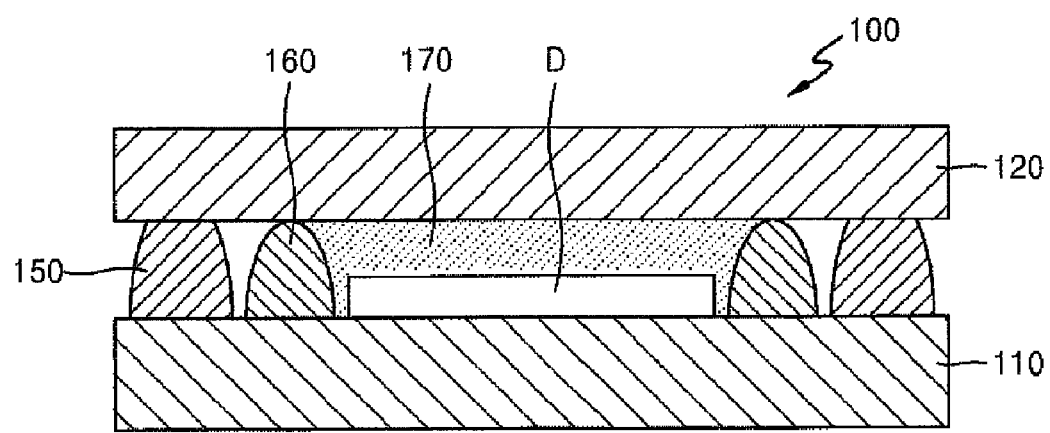
FIG. 2 is a schematic cross-sectional view of the organic light emitting display device of 1 in which first and second substrates are combined together.
Figure 3:
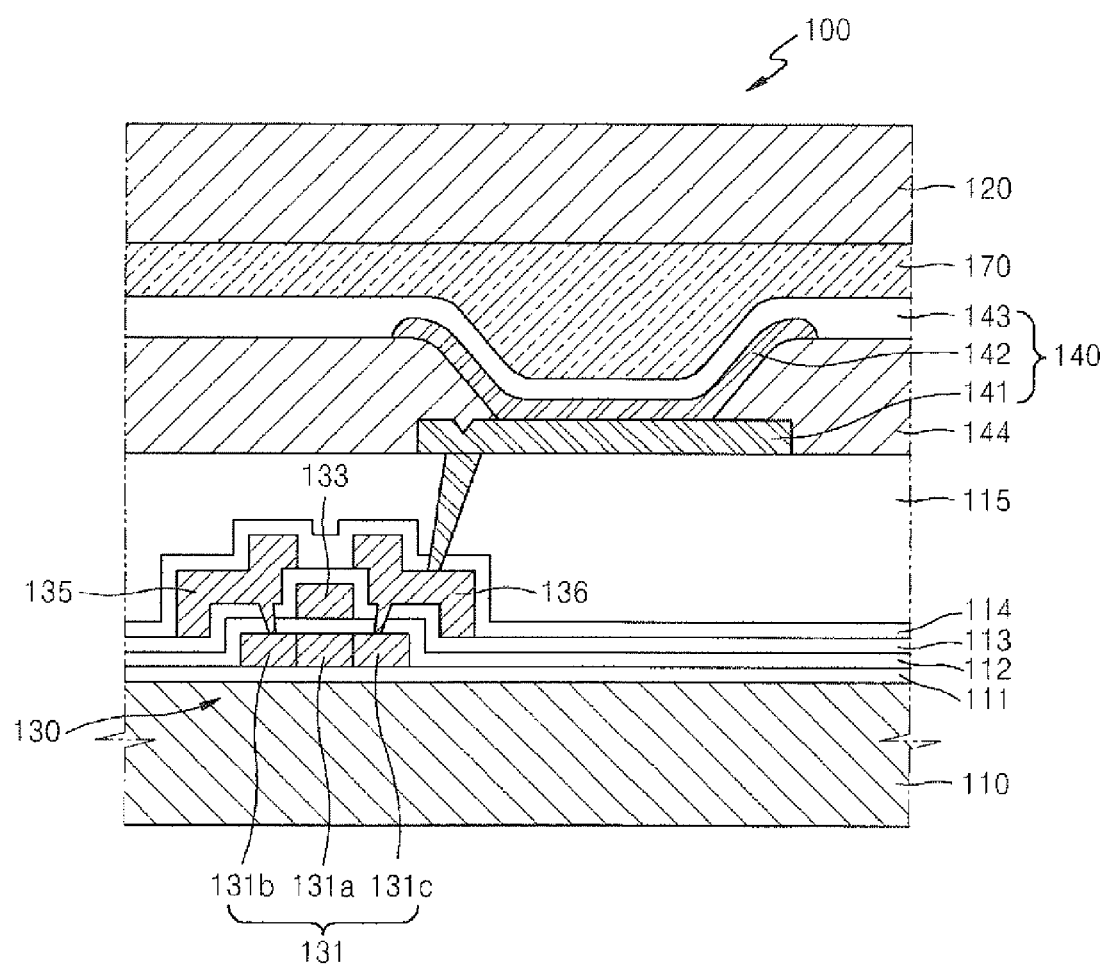
FIG. 3 is a detailed cross-sectional view of a display unit of the organic light emitting display device of FIG. 1.

FIG. 1 is a schematic plan view of part of an organic light emitting display device 100 according to an embodiment of the present invention, FIG. 2 is a schematic cross-sectional view of the organic light emitting display device 100 of FIG. 1 in which first and second substrates 110 and 120 are combined together and FIG. 3 is a detailed cross-sectional view of a display unit D of the organic light emitting display device 100 of FIG. 1.

Referring to FIGS. 1, 2, and 3, the organic light emitting display device 100 according to the present embodiment includes the first substrate 110, the second substrate 120, a sealant 150, a dam portion 160 that includes magnetic particles, and a filling material 170 that also includes magnetic particles.

The display unit D and a pad portion P are arranged on a surface of the first substrate 110 facing the second substrate 120, and the dam portion 160 and the sealant 150 are sequentially arranged to surround a periphery of the display unit D.

The display unit D includes a plurality of organic light emitting diodes (OLEDs) 140 and a plurality of thin film transistors (TFTs) 130 respectively connected to the plurality of OLEDs 140. The organic light emitting display device 100 may be classified into a passive matrix (PM) organic light emitting display device and an active matrix (AM) organic light emitting display device depending on whether the driving of the OLEDs 140 are controlled by the TFTs 130. The organic light emitting display device 100 according to the present embodiment may be applied to both AM and PM organic light emitting display devices. The following description of the organic light emitting display device 100 is that of an AM organic light emitting display device.

The first substrate 110 and the second substrate 120 may be transparent glass substrates in which silicon dioxide (SiO2) is used as a main material, however the present invention is not limited thereto as the first substrate 110 and the second substrate 120 may instead be made out of various other materials such as plastic.

A buffer layer 111 may be made out of at least one of SiO2 and SiNx and be arranged on the first substrate 110 and serve as a planarization layer for the first substrate 110 and prevent the penetration of impure elements.

An active layer 131 of a TFT 130 is made out of a semiconductor material and is arranged on the buffer layer 111, and a gate insulating layer 112 is formed on the buffer layer and covers the active layer 131. The active layer 131 is made out of an inorganic semiconductor material such as amorphous silicon or polysilicon or an organic semiconductor material, and includes a source region 131b, a drain region 131c, and a channel region 131a interposed between the source region 131b and the drain region 131c.

A gate electrode 133 is arranged on the gate insulating layer 112, and an interlayer insulating layer 113 is formed on the gate insulating layer 112 and covers the gate electrode 133. A source electrode 135 and a drain electrode 136 are arranged on the interlayer insulating layer 113, and a passivation layer 114 and a planarization layer 115 are sequentially formed on the interlayer insulating layer 113 in the stated order, and cover the source electrode 135 and the drain electrode 136. Each of the above-described gate insulating layer 112, the interlayer insulating layer 113, the passivation layer 114, and the planarization layer 115 are insulators and may have a single layer structure or a multiple layer structure made out of an inorganic material, an organic material or an organic and inorganic composite material. The above-described stack structure of the TFT 130 is exemplary, and TFTs having various other structures may instead be used and still be within the scope of the present invention.

The pad portion P is arranged on a portion of the first substrate 110, and includes a plurality of pad electrodes (not shown) that are connected to various conductive lines (not shown) of the display unit D for driving display devices, such as data lines, scan lines, and power supply lines, and transmit signals input from an external device to each of the OLEDs 140 of the display unit D via the conductive lines.

A first electrode 141 is arranged on the planarization layer 115 and serves as an anode of an OLED 140, and a pixel defining layer 144 is made out of an insulating material and covers the first electrode 141. After a predetermined opening is formed in the pixel defining 19 layer 144, an organic light emitting layer 142 of the OLED 140 is formed in a region defined by the opening. A second electrode 143 is arranged on the pixel defining layer 144 and covers all pixels and serves as a cathode for the OLED 140, however polarities of the first electrode 141 and the second electrode 142 may be opposite to each other and still be within the scope of the present invention.

The first electrode 141 may be a transparent electrode or a reflective electrode. When the first electrode 141 is a transparent electrode, the first electrode 141 may be made out of indium tin oxide (ITO), indium zinc oxide (IZO), zinc oxide (ZnO) or In2O3. When the first electrode 141 is a reflective electrode, the first electrode 141 may include a reflective layer made out of silver (Ag), magnesium (Mg), aluminum (Al), platinum (Pt), palladium (Pd), gold (Au), nickel (Ni), neodymium (Nd), iridium (Ir), chromium (Cr) or a compound thereof, and a transparent layer made out of ITO, IZO, ZnO or In2O3.

The second electrode 143 may be a transparent electrode or a reflective electrode. When the second electrode 143 is a transparent electrode, the second electrode 143 may include a layer formed by depositing lithium (Li), calcium (Ca), LiF/Ca, LiF/Al, Al, Mg or a compound thereof toward the organic light emitting layer 142, and auxiliary electrode lines or bus electrode lines made out of a transparent conductive material such as ITO, IZO, ZnO or In2O3. When the second electrode 143 is a reflective electrode, the second electrode 143 may be made out of Li, Ca, LiF/Ca, LiF/Al, Al, Mg or a compound thereof.

The organic light emitting layer 142 formed between the first electrode 141 and the second electrode 143 may be made out of a small molecular weight organic material or polymer organic material. When the organic light emitting layer 142 is made out of a small molecular weight organic material, the organic light emitting layer 142 may be formed by stacking a hole injection layer (HIL) (not shown), a hole transport layer (HTL) (not shown), an electron transport layer (ETL) (not shown), an electron injection layer (EIL) (not shown), or the like sequentially on the first electrode 141 in a single or multiple layer structure, with the organic light emitting layer 142 is interposed between the HIL and the HTL. Various small molecular weight organic materials such as copper phthalocyanine (CuPc), N, N'-di(naphthalene-1-yl)-N,N'-diphenyl-benzidine (NPB), tris-8-hydroxyquinoline aluminum)(Alq3), or the like may be used. The organic light emitting layer 142 made out of the above-described small molecular weight organic materials can be produced via vapor deposition using masks.

When the organic light emitting layer 142 is made out of a polymer organic material, a HTL may be additionally formed between the first electrode 141 and the organic light emitting layer 142. In this case, PEDOT is used to form the HTL, and a poly-phenylenevinylene (PPV)-based polymer organic material and a polyfluorene-based polymer organic material are used to form the organic light emitting layer 142.

Although not shown, a spacer (not shown) for maintaining a gap between the OLED 140 and the second substrate 120 may be further formed above the pixel defining layer 144.

The sealant 150 is arranged on the surface of the first substrate 110 that faces the second substrate 120 and surrounds a periphery of the display unit D. The sealant 150 may be arranged on a surface of the second substrate 120 that faces the first substrate 110. The sealant 150 is used to bond the first and second substrates 110 and 120 together and prevent oxygen and moisture from penetrating into the OLED 140 from the outside.

The sealant 150 may be an organic material such as epoxy, or the sealant 150 may be an inorganic material such as frit that does not require an additional, moisture absorbent material. The sealant 150 is used to seal the first and second substrates 120 together by applying a glass material in a paste form to at least one of the first substrate 110 and the second substrate 120, melting the applied glass material using laser or infrared rays and curing the melted glass material.

When inorganic frit is used as the sealant 150 and arranged on the first substrate 110, in order to reinforce interface contact between the frit as the sealant 150 and the first substrate 110, the frit as the sealant 150 may be directly formed on an inorganic insulating layer that extends directly from the display unit D. The inorganic insulating layer that extends directly from the display unit D means that an inorganic insulating layer, such as the gate insulating layer 112, the interlayer insulating layer 113 or the passivation layer 114, is formed at a periphery of the display unit D on which the sealant 150 is arranged during the manufacturing of the above-described TFT 130.

However, in a structure where fit is used as the sealant 150, due to the fragility of fit, when an external shock is applied to the sealant 150, stress may concentrate on an adhering surface of at least one of the first and second substrates 110 and 120 on which the sealant 150 is applied, resulting in cracks in the adhering surface that may spread throughout the entire substrate.

In order to prevent this problem, a filling material 170 can be applied to an inner space of the organic light emitting display device 100 when the first and second substrates 110 and 120 are bonded to each other. The filling material 170 is used to fill the inner space of the organic light emitting display device 100 with material having predetermined elasticity and viscosity to prevent damage to the organic light emitting display device 100 from external shock.

The dam portion 160 is arranged on the first substrate 110 between a periphery of the display unit D and the sealant 150, thereby surrounding the display unit D. The dam portion 160 serves to confine the filling material 170 to a space that is within the dam portion 160.

The dam portion 160 may be made out of a material such as resin that is applied in a liquid form and is naturally cured, thermally cured or ultraviolet (UV) cured. The dam portion 160 may complement for the fragility of the frit and may be an auxiliary layer for protecting the organic light emitting display device 100 from external shock.

As described above, the dam portion 160 confines the filling material 170 to the space within the dam portion 160 so that the filling material 170 and the sealant 150 may be separated from each other so the filling material 170 does not directly contact the sealant 150. If the filling material 170 contacts the sealant 150, the filling material 170 applied around the sealant 150 may deteriorate upon the curing of the sealant 150 due to high temperature, and the OLEDs 140 may then be damaged.

However, when the filling material 170 is completely filled within the space and reaches the sealant 150, or when, due to a reason such as a process margin, the filling material 170 has a volume that exceeds that of the space that it is applied, spreading of the filling material 170 to the sealant 150 may not be efficiently controlled by only using the dam portion 160 described above, resulting in contact between the sealant 150 and the filling material 170.

In order to solve this problem, the filling material 170 and the dam portion 160 that surrounds the filling material 170 may include magnetic particles. For example, the magnetic particles may include a diamagnetic substance having a magnetic moment in an opposite direction to a direction in which a magnetic field is applied, and a paramagnetic substance having a pure magnetic moment in alignment with a direction in which a magnetic field is applied. The magnetic particles may also include a ferromagnetic material including an alloy such as iron (Fe), cobalt (Co), and nickel (Ni) or a compound thereof, however the present invention is not limited thereto as any atomic or molecular particles that have electrons that have a magnetic moment that interact with a magnetic field may be used as the magnetic particles for the filling material 170 and the dam portion 160.

Figure 4:
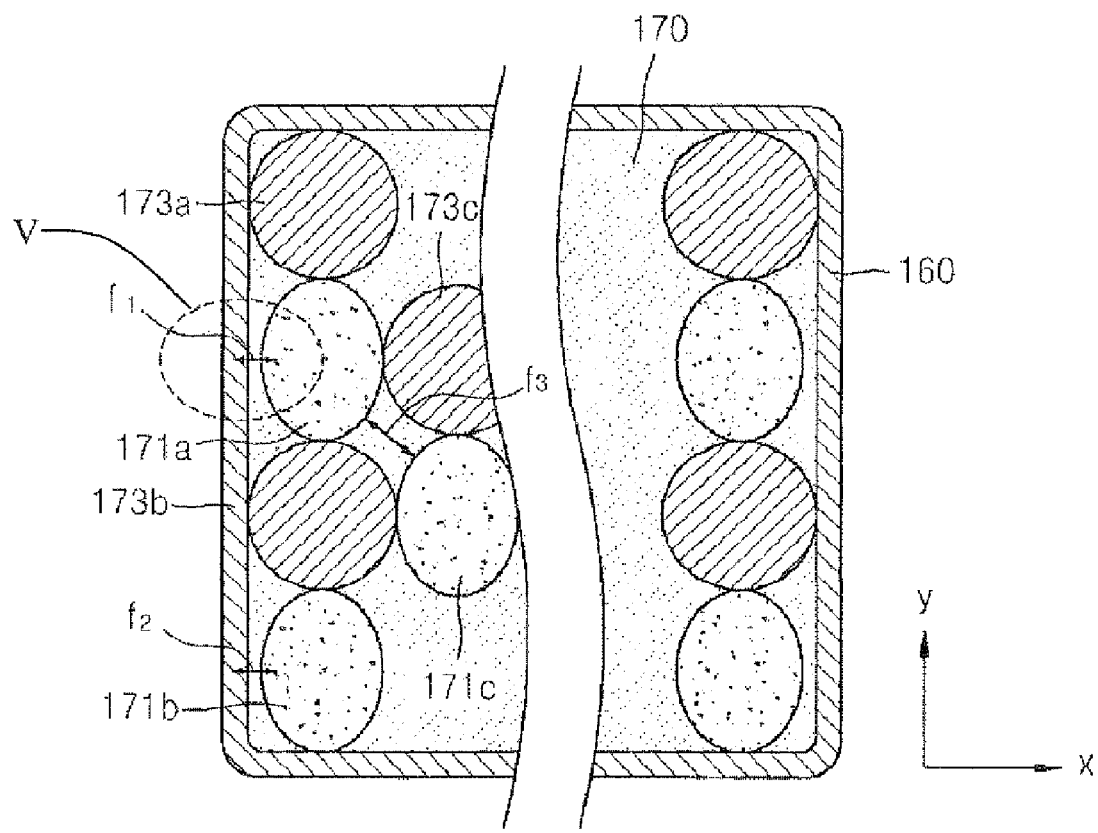
FIG. 4 is a cross-sectional view for explaining a concept of a dam portion and a filling portion of the organic light emitting display device of FIG. 1.

The dam portion 160 and the filling material 170 of the organic light emitting display device 100 of FIG. 1 will now be described with reference to FIGS. 4 and 5 in more detail. FIG. 4 is a cross-sectional view for explaining a concept of the dam portion 160 and the filling material 170 of the organic light emitting display device 100 of FIG. 1, and FIG. 5 is an enlarged view of portion V of FIG. 4.

Figure 5:
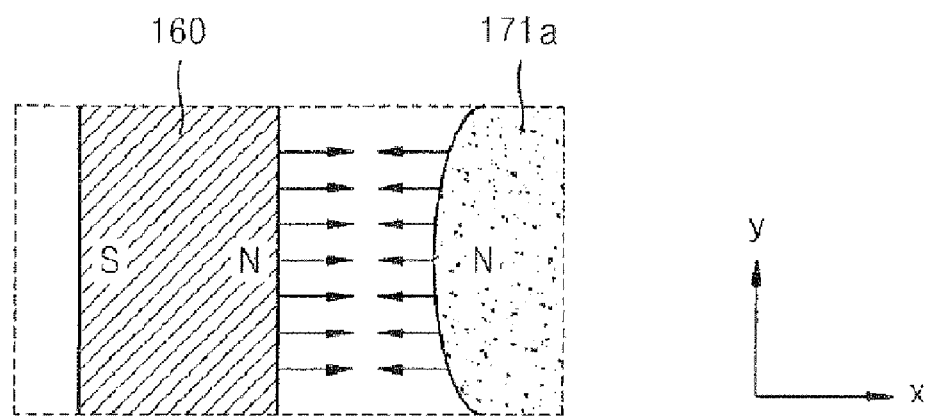
FIG. 5 is an enlarged view of portion V of FIG. 4.

Referring to FIGS. 4 and 5, between the dam portion 160 and ones of the magnetic particles 171a and 171b of the filling material 170, magnetism is distributed so that repulsive forces f1 and f2 may be exerted between the adjacent surfaces of dam portion 160 and ones of the magnetic particles 171a and 171b of the filling material 170. For example, the surface of the dam portion 160 facing the display unit D has a N polarity, the surface of ones of the magnetic particles 171a and 171b facing the dam portion 160 also has the N polarity. Thus, the magnetic particles 171a and 171b of the filling material 170 are confined by the dam portion 160 due to the repulsive forces f1 and f2 between the dam portion 160 and ones of the magnetic particles 171a and 171b respectively of the filling material 170, resulting in a remarkable reduction in the amount of the filling material 170 that reaches the sealant 150.

When the filling material 170 is deposited within the dam portion 160 in order for the magnetic particles 171a and 171b of the filling material 170 to have directivity of magnetism as described above, the filling material 170 may be formed using a magnetic particle alignment mask or a magnetic particle alignment nozzle. The position or size of the alignment of the magnetic particles 171a and 171b may be changed in various ways.

The filling material 170 may further include non-magnetic particles 173a, 173b, and 173e. A repulsive force f3 may be exerted between adjacent ones of magnetic particles 171a, 171b, and 171c, as described above, and the non-magnetic particles 173a, 173b, and 173c may be arranged between ones of the magnetic particles 171a, 171b, and 171c so that the action of the filling material 170 may be well shown.

In the organic light emitting display device 100 of FIG. 1 described above, magnetic particles are distributed in the dam portion 160 and in the filling material 170 so that the dam portion 160 and the filling material 170 may exert a repulsive magnetic force on each other to prevent the filling material from contacting sealant 150.

Meanwhile, it is understood by one of ordinary skill in the art that the sizes of the magnetic particles 171a, 171b, and 171c and the non-magnetic particles 173a, 173b, and 173c illustrated in FIG. 4 are exaggerated for convenience of description.

Figure 6:
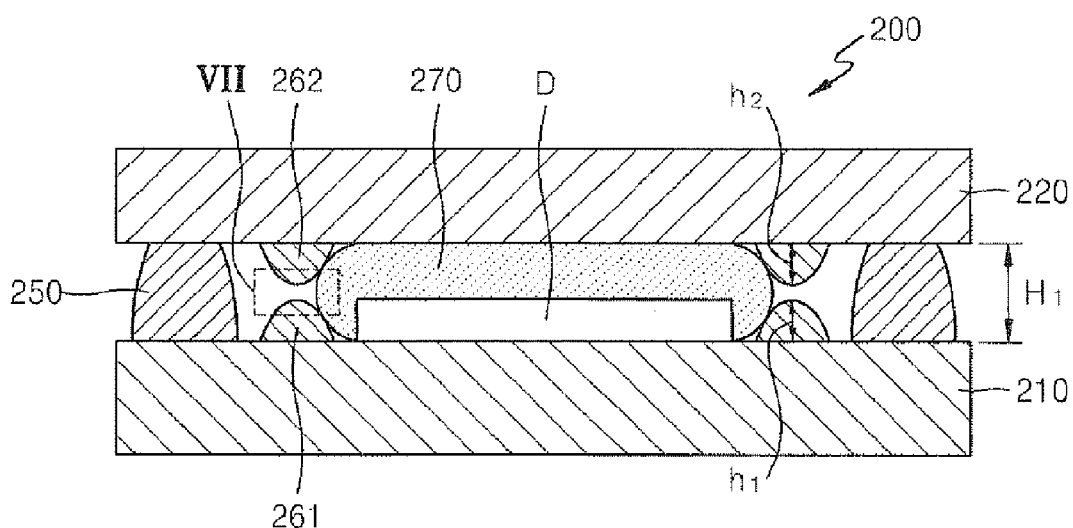
FIG. 6 is a schematic cross-sectional view of an organic light emitting display device according to another embodiment of the present invention.

Hereinafter, an organic light emitting display device according to another embodiment of the present invention will be described with reference to FIGS. 6 and 7. FIG. 6 is a schematic cross-sectional view of an organic light emitting display device 200 according to another embodiment of the present invention, and FIG. 7 is an enlarged view of portion VII of FIG. 6.

Figure 7:
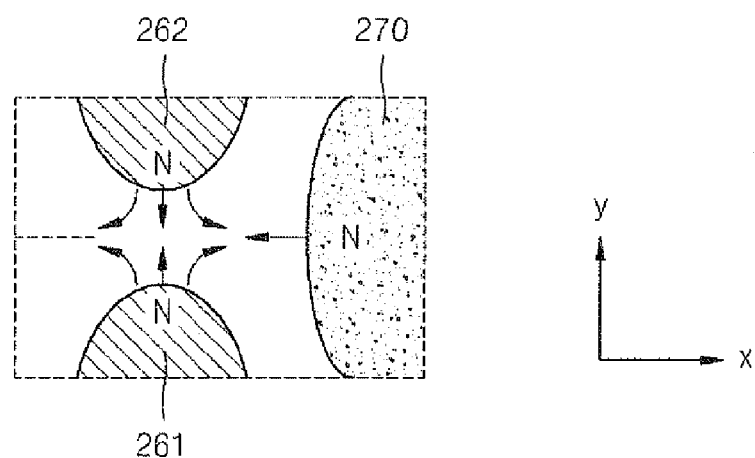
FIG. 7 is an enlarged view of portion VII of FIG. 6.

Referring to FIGS. 6 and 7, the organic light emitting display device 200 according to the present embodiment includes a first substrate 210, a second substrate 220, a sealant 250, a first dam portion 261 including magnetic particles (not shown), a second dam portion 262 including magnetic particles (not shown), and a filling material 270 including magnetic particles (not shown).

A display unit D and a pad portion P (not shown) are arranged on a surface of the first substrate 210 facing the second substrate 220, and the sealant 250 is arranged on a portion of the surface of the first substrate 210 facing the second substrate 220 that surrounds a periphery of the display unit D. The first dam portion 261 is arranged on the portion of the surface of the first substrate 210 facing the second substrate 220 between the periphery of display unit D and the sealant 250, the first dam portion 261 surrounding the periphery the display unit D. Similarly, the second dam portion 262 is arranged on a portion of a surface of the second substrate 220 correspondingly facing the first dam portion 261, the second dam portion thus also surrounding the periphery of the display unit D.

Hereinafter, a difference between the organic light emitting display device 200 of FIG. 6 and the organic light emitting display device 100 of FIG. 1 will be described.

The display unit D includes a plurality of OLEDs (not shown) and a plurality of TFTs respectively connected to the plurality of OLEDs, and the organic light emitting display device 200 of FIG. 6 may be applied to both an AM organic light emitting display device and a PM organic light emitting display device.

The first substrate 210 and the second substrate 220 may be a transparent glass substrate in which $SiO_2$ is used as a main material, however the present invention is in no way so limited as the first substrate 210 and the second substrate 220 may instead be made out of other various materials such as plastic.

The sealant 250 is arranged on a portion of the surface of the first substrate 210 facing the second substrate 220 that surrounds the periphery of the display unit D. The sealant 250 is also arranged on the surface of the second substrate 220 facing the first substrate 210. The sealant 250 is used to bond the first and second substrates 210 and 220 together and prevent oxygen and moisture from penetrating into the OLEDs of display unit D from the outside.

When inorganic frit is used as the sealant 250, in order to reinforce interface contact between the frit as the sealant 250 and the first substrate 210, the frit as the sealant 250 may be directly arranged on an inorganic insulating layer arranged on the first substrate 210 and extending directly from the display unit D.

The first dam portion 261 is arranged between the sealant 250 and the periphery of the display unit D and surrounds the periphery of the display unit D. Likewise, the second dam portion 262 is arranged on the surface of the second substrate 220 correspondingly facing the first dam portion 261, thereby surrounding the periphery of the display unit D.

The first dam portion 261 and the second dam portion 262 each include magnetic particles (not shown). Magnetism is distributed on adjacent surfaces of the first and second dam portions 261 and 262, so that the first dam portion 261 and the second dam portion 262 may exert a repulsive force on each other.

Also, the first dam portion 261 and the second dam portion 262 are separated from each other by an interval. The sum of a height h1 of the first dam portion 261 and a height h2 of the second dam portion 262 may be less than a gap H1 between the first substrate 210 and the second substrate 220.

The filling material 270 is arranged within a space formed when the first substrate 210 and the second substrate 220 are bonded to each other. The filling material 270 is used to fill the space of the organic light emitting display device 200 with material having predetermined elasticity and viscosity, thereby preventing damage to the organic light emitting display device 200 from external shock.

The filling material 270 includes the magnetic particles having magnetism. Because of the inclusion of the magnetic particles, adjacent surfaces of the filling material 270, the first dam portion 261 and the second dam portion 262 all exert repulsive magnetic forces on each other. For example, the surface of the first dam portion 261 that faces the second dam portion 262 and the surface of the second dam portion 262 that faces the first dam portion 261 each have an N polarity, and the surface of the filling material 270 that faces the first and second dam portions 261 and 262 also has an N polarity as illustrated in FIG. 7. These repulsive magnetic forces cause the filling material 270 to remain confined within the space formed by the first dam portion 261 and the second dam portion 262, and the amount of the filling material 270 that reaches the sealant 250 is therefore remarkably reduced.

The filling material 270 may further include non-magnetic particles (not shown), like in the above-described embodiment of FIG. 1. The non-magnetic particles may be arranged between ones of the magnetic particles so that the action of the filling material 270 may be well shown.

In the organic light emitting display device 200 of FIG. 6 described above, the repulsive forces are exerted between the first dam portion 261 and the second dam portion 262, and magnetism is distributed within each of the first and second dam portions 261 and 262 and the filling material 270 so that the first and second dam portions 261 and 262 and the filling material 270 may exert repulsive forces on each other to prevent contact between the sealant 250 and the filling material 270. With such a design, deterioration of the OLEDs in display unit D may be prevented.

Hereinafter, an organic light emitting display device according to another embodiment of the present invention will be described with reference to FIGS. 8 and 9.

Figure 8:
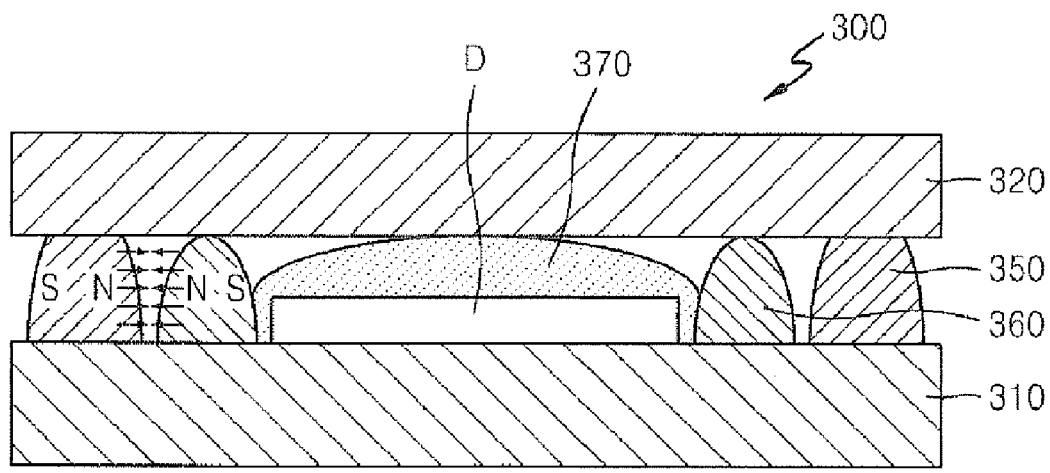
FIG. 8 is a schematic cross-sectional view of an organic light emitting display device according to another embodiment of the present invention.
Figure 9:
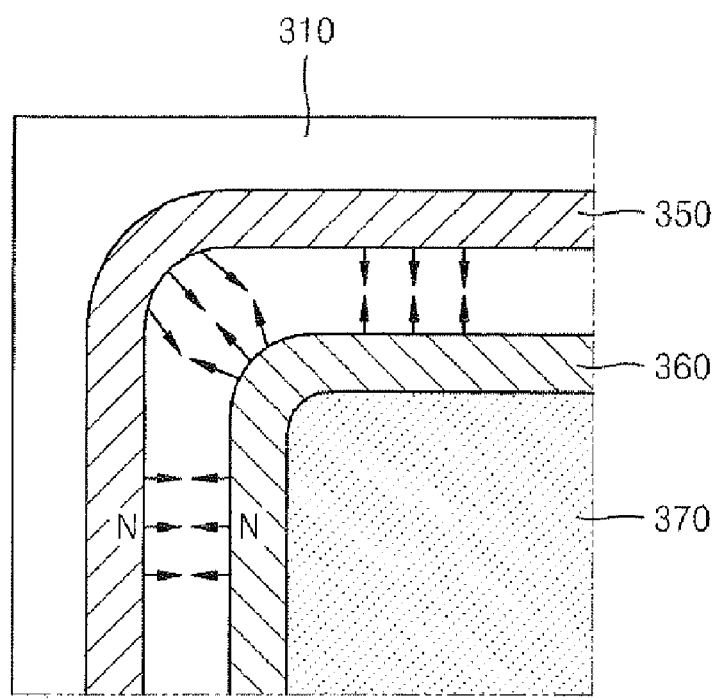
FIG. 9 is a cross-sectional view for explaining a concept of the organic light emitting display device of FIG. 8.

FIG. 8 is a schematic cross-sectional view of an organic light emitting display device 300 according to another embodiment of the present invention, and FIG. 9 is a cross-sectional view for explaining a concept of the organic light emitting display device 300 of FIG. 8.

Referring to FIGS. 8 and 9, the organic light emitting display device 300 according to the present embodiment includes a first substrate 310, a second substrate 320, a sealant 350 that includes magnetic particles (not shown), a dam portion 360 that includes magnetic particles (not shown), and a filling material 370 that also includes magnetic particles (not shown).

A display unit D and a pad portion P (not shown) are arranged on a surface of the first substrate 310 facing the second substrate 320, and the dam portion 360 and the sealant 350 are sequentially arranged on a portion of the surface of the first substrate 310 to surround a periphery of the display unit D.

Hereinafter, a difference between the organic light emitting display device 300 of FIG. 8 and the organic light emitting display devices 100 and 200 of FIGS. 1 and 6 respectively will now be described.

The display unit D includes a plurality of OLEDs (not shown) and a plurality of TFTs respectively connected to the plurality of OLEDs, and the organic light emitting display device 300 of FIG. 8 may be applied to both an AM organic light emitting display device and a PM organic light emitting display device.

The first substrate 310 and the second substrate 320 may be transparent glass substrates in which SiO2 is used as a main material, however the present invention is in no way so limited as the first substrate 310 and the second substrate 320 may instead be made out of various other materials such as plastic.

The sealant 350 is arranged on the surface of the first substrate 310 facing the second substrate 320 and surrounds a periphery of the display unit D. The sealant 350 is used to bond the first and second substrates 310 and 320 together and prevent oxygen and moisture from penetrating into the OLEDs of display unit D from the outside. When inorganic fit material is used as the sealant 350, in order to reinforce the interface contact between the sealant 350 and the first substrate 310, the frit as the sealant 350 may be directly arranged on an inorganic insulating layer that extends directly from the display unit D. In the present embodiment, the sealant 350 includes magnetic particles (not shown).

The dam portion 360 that includes magnetic particles (not shown) is separated from the sealant 350 by an interval and is arranged between the sealant 350 and a periphery of the display unit D, thereby surrounding the periphery of the display unit D. Magnetism is distributed in a portion of dam portion 360 that faces the sealant 350 so that the dam portion 360 and the sealant 350 may exert a repulsive force on each other. For example, facing adjacent surfaces of the dam portion 360 and the sealant 350 both have an N polarity as illustrated in FIG. 9.

The filling material 370 having magnetism is arranged within an inner space defined by the dam portion 360 and the first and second substrates 310 and 320. The filling material 370 includes magnetic particles (not shown) as in the above-described organic light emitting display devices 100 and 200 of FIGS. 1 and 6. By including magnetic particles in the filling material 370, magnetism is distributed on a surface of the filling material 370 that faces the dam portion 360 so that the filling material 370 and the dam portion 360 may exert a repulsive force on each other. Because of this repulsive force, the filling material 370 is efficiently confined within the dam portion 360.

Meanwhile, the filling material 370 includes non-magnetic particles (not shown) as well as the magnetic particles (not shown) as in the above-described organic light emitting display devices 100 and 200 of FIGS. 1 and 6. The non-magnetic particles are arranged between ones of the magnetic particles so that the action of the filling material 370 may be well shown.

In the organic light emitting display device 300 of FIG. 8 described above, magnetic particles are included in the sealant 350, the dam portion 360, and the filling material 370 so that the repulsive forces may be exerted between facing surfaces of the sealant 350 and the dam portion 360, and between facing surfaces of the dam portion 360 and the filling material 370. Because of these repulsive forces, contact between the sealant 350 and the filling material 370 may be more efficiently prevented thereby preventing deterioration of the OLEDs within display unit D.

Figure 10:
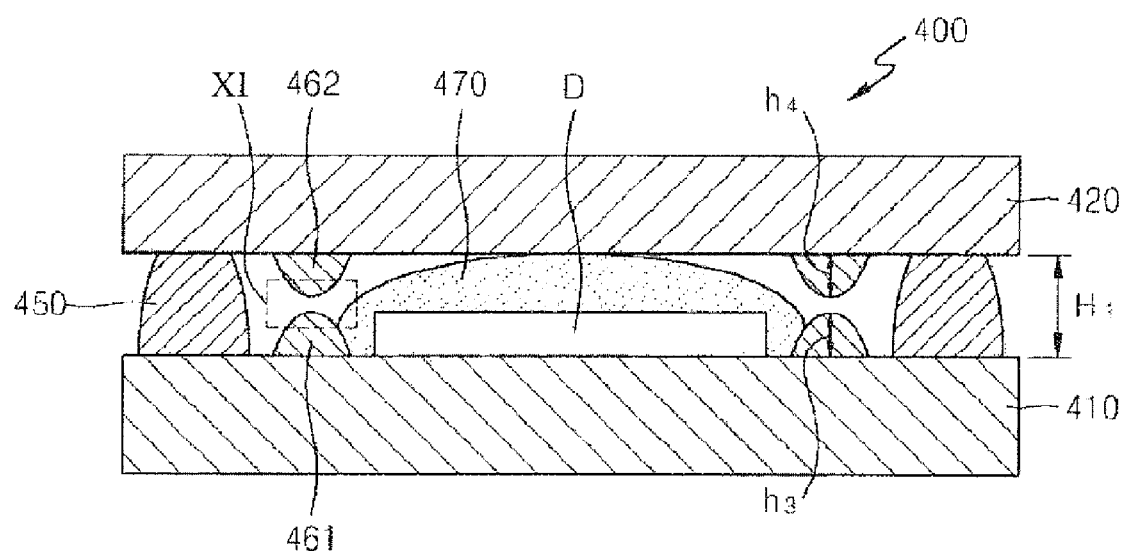
FIG. 10 is a schematic cross-sectional view of an organic light emitting display device according to another embodiment of the present invention.

Hereinafter, an organic light emitting display device according to another embodiment of the present invention will be described with reference to FIGS. 10 and 11. FIG. 10 is a schematic cross-sectional view of an organic light emitting display device 400 according to another embodiment of the present invention and FIG. 11 is an enlarged view of portion XI of FIG. 10.

Figure 11:
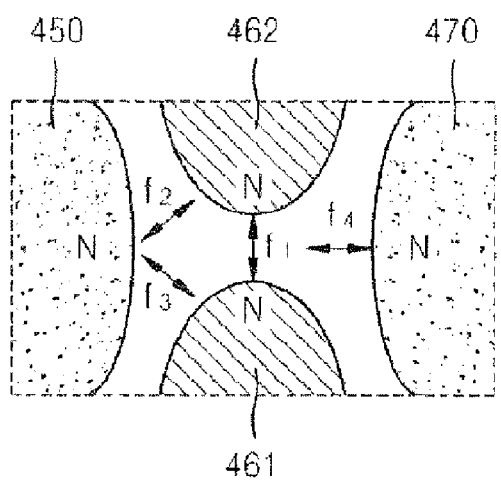
FIG. 11 is an enlarged view of portion XI of FIG. 10.

Referring to FIGS. 10 and 11, the organic light emitting display device 400 according to the present embodiment includes a first substrate 410, a second substrate 420, a sealant 450 that includes magnetic particles (not shown), a first dam portion 461 that includes magnetic particles (not shown), a second dam portion 462 that includes magnetic particles (not shown), and a filling material 470 that also includes magnetic particles (not shown).

A display unit D and a pad portion P (not shown) are arranged on a surface of the first substrate 410 facing the second substrate 420, and the sealant 450 is arranged on a portion of the surface of the first substrate 410 that surrounds a periphery of the display unit D. The first dam portion 461 is arranged on the portion of the surface of the first substrate 410 between the sealant 450 and a periphery of the display unit D, and surrounds the periphery of the display unit D. The second dam portion 462 is arranged on a surface of the second substrate 420 correspondingly facing the first dam portion 461 and surrounds the periphery of the display unit D.

Hereinafter, a difference between the organic light emitting display device 400 of FIG. 10 and the organic light emitting display devices 100, 200 and 300 of FIGS. 1, 6 and 8 respectively will now be described.

The display unit D includes a plurality of OLEDs (not shown) and a plurality of TFTs respectively connected to the plurality of OLEDs, and the organic light emitting display device 400 of FIG. 10 may be applied to both an AM organic light emitting display device and a PM organic light emitting display device.

The first substrate 410 and the second substrate 420 may be transparent glass substrates in which SiO2 is used as a main material, however the present invention is in no way so limited as the first substrate 410 and the second substrate 420 may instead be made out of various other materials such as plastic.

The sealant 450 is arranged on the surface of the first substrate 410 facing the second substrate 420 and surrounds the periphery of the display unit D. The sealant 450 may be arranged on the surface of the second substrate 420 facing the first substrate 410. The sealant 450 is used to bond the first and second substrates 410 and 420 together and prevent oxygen and moisture from penetrating into the OLEDs of display unit D from the outside. When inorganic frit material is used as the sealant 450, in order to reinforce interface contact between the sealant 450 and the first substrate 410, the sealant 450 may be directly arranged on an inorganic insulating layer that extends directly from the display unit D. In the present embodiment, the sealant 450 includes the magnetic particles (not shown).

The first dam portion 461 is arranged between the sealant 450 and a periphery of display unit D and surrounds the periphery of display unit D. The second dam portion 462 is arranged on the surface of the second substrate 420 correspondingly facing the first dam portion 461 and surrounds the periphery of display unit D.

The first dam portion 461 and the second dam portion 462 each include magnetic particles (not shown). Magnetism is distributed on facing and adjacent surfaces of the first and second dam portions 461 and 462 so that the first dam portion 461 and the second dam portion 462 may exert a repulsive force f1 on each other. Also, the first dam portion 461 and the second dam portion 462 are separated from each other by an interval. The sum of a height h3 of the first dam portion 461 and a height h4 of the second dam portion 462 may be less than a gap H1 between the first substrate 410 and the second substrate 420.

The filling material 470 having magnetic particles is arranged within an inner space between the first and second substrates 410 and 420 when the first substrate 410 and the second substrate 420 are bonded together. The filling material 470 includes the magnetic particles (not shown), like in the above-described organic light emitting display devices 100, 200, and 300 of FIGS. 1, 6, and 8.

By including magnetic particles in the sealant 450, the first dam portion 461, the second dam portion 462, and the filling material 470, magnetism is distributed on facing adjacent surfaces of the sealant 450, the first dam portion 461, the second dam portion 462, and the filling material 470 so that the sealant 450, the first dam portion 461, the second dam portion 462, and the filling material 470 may exert repulsive magnetic forces f1 through f4 on each other. Because of these repulsive forces f1 through f4, the filling material 470 is more efficiently and effectively confined within a space formed by the first dam portion 461, the second dam portion 462, the first substrate 410 and the second substrate 420.

Although it is possible for the filling material 470 emerge outside the space formed by the first dam portion 461 and the second dam portion 462, repulsive forces f2 and f3 that act between the sealant 450 and the first and second dam portions 461 and 462 also act on the filling material 470 so that the filling material 470 may be more effectively and efficiently prevented from reaching the sealant 450.

Meanwhile, the filling material 470 may further include non-magnetic particles (not shown), like in the above-described organic light emitting display devices 100, 200, and 300 of FIGS. 1, 6, and 8. The non-magnetic particles may be arranged between the magnetic particles so that the action of the filling material 470 may be well shown.

In the organic light emitting display device 400 of FIG. 10 described above, the repulsive forces f1, f2, and f3 are exerted between the sealant 450, the first dam portion 461 and the second dam portion 462, and magnetic particles are distributed within the first and second dam portions 461 and 462 and the filling material 470 so that the first and second dam portions 461 and 462 and the filling material 470 may exert a repulsive force f4 on each other. Repulsive magnetic forces f1 through f4 serve to prevent the filling material from contacting the sealant 450, thereby preventing deterioration of the OLEDs.

As described above, in an organic light emitting display device according to the present invention, contact between frit as a sealant and a filling material can be effectively and efficiently prevented so that deterioration of an organic light emitting diode (OLED) can be prevented.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display device, comprising:
   a first substrate including a display unit that includes at least one organic light emitting diode (OLED);
   a second substrate facing the first substrate;
   a sealant surrounding a periphery of the display unit and bonding the second substrate to the first substrate;
   a dam portion arranged between the periphery of the display unit and the sealant and surrounding the periphery of the display unit and including a plurality of magnetic particles; and
   a filling material arranged within an inner space defined by the dam portion and the first and second substrates, the filling material including a plurality of magnetic particles.

2. The device of claim 1, wherein the sealant comprises frit.

3. The device of claim 2, further comprising an inorganic insulating layer arranged on the first substrate and extending from the display unit to outside a periphery of the display unit, wherein the frit is arranged on the inorganic insulating layer.

4. The device of claim 1, wherein facing and adjacent surfaces of the dam portion and the filling material repel each other due to the magnetic particles in the filling material and the magnetic particles in the dam portion.

5. The device of claim 1, wherein the filling material further comprises a plurality of non-magnetic particles having no magnetism.

6. The device of claim 1, wherein the dam portion is separated from the sealant by an interval.

7. The device of claim 1, wherein the sealant comprises a plurality of magnetic particles.

8. The device of claim 7, wherein facing and adjacent surfaces of the sealant and the dam portion repel each other due to the magnetic particles in the sealant and the magnetic particles in the dam portion.

9. An organic light emitting display device, comprising:
   a first substrate including a display unit that includes at least one organic light emitting diode (OLED);
   a second substrate facing the first substrate;
   a sealant surrounding a periphery of the display unit and bonding the second substrate to the first substrate;
   a first dam portion arranged on a surface of the first substrate facing the second substrate, the first dam portion being arranged between the display unit and the sealant and surrounding the periphery of the display unit, the first dam portion including a plurality of magnetic particles;

a second dam portion arranged on a surface of the second substrate correspondingly facing the first dam portion and including a plurality of magnetic particles; and a filling material arranged within a space defined by the first and second dam portions and the first and second substrates, the filling material including a plurality of magnetic particles.

10. The device of claim 9, wherein the sealant comprises frit.

11. The device of claim 10, further comprising an inorganic insulating layer arranged on the first substrate and extending from the display unit to outside a periphery of the display unit, wherein the frit is arranged on the inorganic insulating layer.

12. The device of claim 9, wherein the first and second dam portions repel each other due to the first and second dam portions each comprising a plurality of magnetic particles.

13. The device of claim 9, wherein the first and second dam portions are separated from each other by an interval.

14. The device of claim 9, wherein a sum of a height of the first dam portion and a height of the second dam portion is less than a gap between the first and second substrates.

15. The device of claim 9, wherein the filling material and the first and second dam portions repel each other due to the magnetic particles in each of the filling material and the first and second dam portions.

16. The device of claim 9, wherein the filling material further comprises non-magnetic particles having no magnetism.

17. The device of claim 9, wherein the first and second dam portions are separated from the sealant by an interval.

18. The device of claim 9, wherein the sealant comprises a plurality of magnetic particles.

19. The device of claim 18, wherein the sealant and the first and second dam portions repel each other due to the magnetic particles in the sealant and the magnetic particles in the first and second dam portions.

\* \* \* \* \*